(12) United States Patent
Ramabhadran et al.

(10) Patent No.: US 10,374,591 B2
(45) Date of Patent: Aug. 6, 2019

(54) SYSTEMS AND METHODS FOR A GATE DRIVE CIRCUIT

(71) Applicant: General Electric Company, Schenectady, NY (US)

(72) Inventors: Ramanujam Ramabhadran, Niskayuna, NY (US); Sayan Acharya, Niskayuna, NY (US); Han Peng, Niskayuna, NY (US); Maja Harfman Todorovic, Niskayuna, NY (US); Ahmed Elasser, Niskayuna, NY (US); Robert Thomas, Niskayuna, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 177 days.

(21) Appl. No.: 15/397,443

(22) Filed: Jan. 3, 2017

(65) Prior Publication Data
US 2018/0191338 A1    Jul. 5, 2018

(51) Int. Cl.
| | | |
|---|---|---|
| *H01L 29/16* | (2006.01) | |
| *H01L 29/20* | (2006.01) | |
| *H01L 29/24* | (2006.01) | |
| *H03K 17/06* | (2006.01) | |
| *H03K 17/16* | (2006.01) | |
| *H01L 29/778* | (2006.01) | |
| *H03K 17/0812* | (2006.01) | |

(52) U.S. Cl.
CPC ..... *H03K 17/063* (2013.01); *H03K 17/08122* (2013.01); *H03K 17/163* (2013.01); *H01L 29/1608* (2013.01); *H01L 29/2003* (2013.01); *H01L 29/24* (2013.01); *H01L 29/778* (2013.01); *H03K 17/08128* (2013.01)

(58) Field of Classification Search
CPC ........... H03K 17/063; H03K 17/08122; H03K 17/163; H01L 29/778
USPC .................................................. 327/108–112
See application file for complete search history.

(56) References Cited

U.S. PATENT DOCUMENTS

| | | |
|---|---|---|
| 5,418,410 A | 5/1995 | Tisinger |
| 5,872,705 A | 2/1999 | Loftus et al. |
| 7,768,337 B2 | 8/2010 | Bayerer |
| 7,839,185 B2 | 11/2010 | Schwarzer |

(Continued)

FOREIGN PATENT DOCUMENTS

| | | |
|---|---|---|
| JP | 2012-199763 A | 10/2012 |
| JP | 2013-026924 A | 2/2013 |
| WO | 20160012553 A1 | 1/2016 |

OTHER PUBLICATIONS

Extended European Search Report and opinion issued in connection with corresponding EP Application No. 17207351.2 dated May 11, 2018.

(Continued)

*Primary Examiner* — Lincoln D Donovan
*Assistant Examiner* — Diana J. Cheng
(74) *Attorney, Agent, or Firm* — Meagher Emanuel Laks Goldberg & Liao, LLP

(57) ABSTRACT

Systems and methods provided herein relate to a gate drive circuit for controlling operation of a wide bandgap semiconductor switch. The systems and methods receive a control signal and configuring an operation signal configured to activate a wide bandgap switch (WBG switch). A profile of the operation signal being based on electrical characteristics of first and second shaping circuits. The systems and methods further deliver the operation signal to the WBG switch.

20 Claims, 5 Drawing Sheets

(56) References Cited

U.S. PATENT DOCUMENTS

| | | |
|---|---|---|
| 2008/0265980 A1 | 10/2008 | Reichl et al. |
| 2010/0176783 A1 | 7/2010 | Tagome |
| 2015/0162905 A1 | 6/2015 | Wagoner et al. |
| 2015/0357904 A1 | 12/2015 | Odell et al. |
| 2015/0372678 A1 | 12/2015 | Zhang et al. |
| 2016/0261266 A1 | 9/2016 | Kampl et al. |

OTHER PUBLICATIONS

Broadmeadow et al., "An Improved Gate Driver for Power MOSFETs Using a Cascode Configuration", 7th IET International Conference on Power Electronics, Machines and Drives, Apr. 8-10, 2014.

Wang et al., "A Di/Dt Feedback-Based Active Gate Driver for Smart Switching and Fast Overcurrent Protection of IGBT Modules", IEEE Transactions on Power Electronics, vol. 29, Issue 7, pp. 3720-3732, Jul. 2014.

Chen et al., "An Automatic IGBT Collector Current Sensing Technique via the Gate Node", Proceedings of International Exhibition and Conference for Power Electronics, Intelligent Motion, Renewable Energy and Energy Management, May 10-12, 2016.

SYSTEMS AND METHODS FOR A GATE DRIVE CIRCUIT

FIELD

Embodiments of the subject matter described herein relate to a gate drive circuit for controlling operation of a wide bandgap semiconductor switch.

BACKGROUND

Wide bandgap semiconductor switches may be utilized as electronic switches for power terminals of high voltage semiconductors operating at higher frequencies and temperatures relative to conventional semiconductors. The wide bandgap semiconductor switch has a low threshold voltage and high saturation velocity resulting in relatively quick transitions between ON and OFF states relative to conventional semiconductors. Conventional gate drive circuits only control activation and clamping of the wide bandgap semiconductor switch utilizing a secondary switch. The conventional gate drive circuits do not control a rate of rise of the gate, but simply activate the producing voltage spikes and/or oscillations (e.g., ringing). Thereby, there is a need for a gate drive circuit to operate the wide band gap semiconductor switch through a Miller plateau region.

BRIEF DESCRIPTION

In an embodiment a system (e.g., a gate drive system) is provided. The system includes a wide bandgap switch (WBG switch) and a control switch conductively coupled to a control terminal and a gate terminal of the WBG switch. The WBG switch and the control switch are configured to have a common threshold voltage. The system further includes first and second shaping circuits conductively coupled to the control switch and the gate terminal of the WBG switch. The first and second shaping circuits and the control switch are configured to define an operation signal. The operation signal being configured to activate the WBG switch. The operation signal includes a profile based on electrical characteristics of the first and second shaping circuits.

In an embodiment a method is provided. The method includes receiving a control signal and configuring an operation signal configured to activate a wide bandgap switch (WBG switch). A profile of the operation signal being based on electrical characteristics of first and second shaping circuits. The method further includes delivering the operation signal to the WBG switch.

In an embodiment a system (e.g., a gate drive system) is provided. The system includes a wide bandgap switch (WBG switch) and a control switch conductively coupled to a control terminal and a gate terminal of the WBG switch. The WBG switch and the control switch are configured to have a common activation threshold. The control switch having a gate terminal conductively coupled to a voltage source. The voltage source being a diode, a capacitor, or a control signal. The system further includes first and second shaping circuits conductively coupled to the control switch and the gate terminal of the WBG switch. The first and second shaping circuits and the control switch are configured to define an operation signal. The operation signal being formed by three shaping phases. A first shaping phase is defined by the electrical characteristics of the first and second shaping circuits. A second shaping phase is defined by the electrical characteristics of the second shaping circuit and the control switch. A third shaping phase is defined by the control switch. The operation signal is configured to activate the WBG switch. A profile of the operation signal being based on electrical characteristics of the first and second shaping circuits.

DETAILED DESCRIPTION

Figure 1:
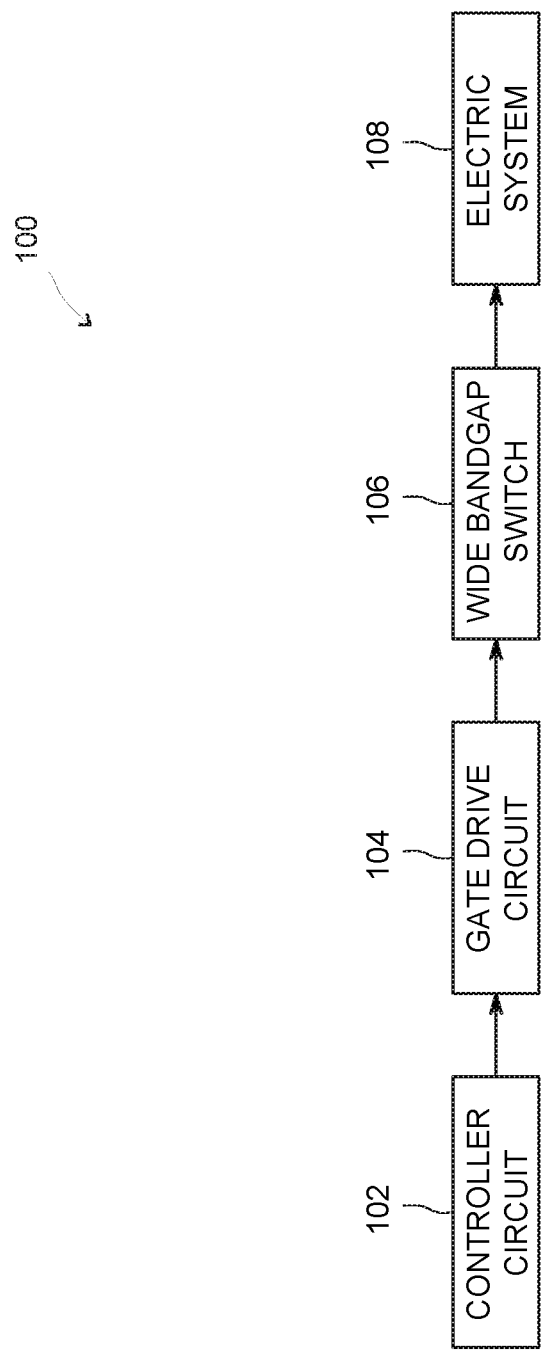
FIG. 1 illustrates a block diagram of an embodiment of a gate drive system.

Various embodiments will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, any programs may be stand-alone programs, may be incorporated as subroutines in an operating system, may be functions in an installed software package, and the like. It should be understood that the various embodiments are not limited to the arrangements and instrumentality shown in the drawings.

As used herein, the terms "system," "unit," or "module" may include a hardware and/or software system that operates to perform one or more functions. For example, a module, unit, or system may include a computer processor, controller, or other logic-based device that performs operations based on instructions stored on a tangible and non-transitory computer readable storage medium, such as a computer memory. Alternatively, a module, unit, or system may include a hard-wired device that performs operations based on hard-wired logic of the device. The modules or units shown in the attached figures may represent the hardware that operates based on software or hardwired instructions, the software that directs hardware to perform the operations, or a combination thereof. The hardware may include electronic circuits that include and/or are connected to one or more logic-based devices, such as microprocessors, processors, controllers, or the like. These devices may be off-the-shelf devices that are appropriately programmed or instructed to perform operations described herein from the instructions described above. Additionally or alternatively, one or more of these devices may be hard-wired with logic circuits to perform these operations.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Generally, various embodiments provide methods and systems for a gate drive system having a gate drive circuit to operate a wide bandgap switch (WBG switch). The WBG switch may include Silicon Carbide (SiC), Aluminum Gallium Nitride (AlGaN), Gallium Nitride (GaN), Gallium Oxide (GaO), and/or the like. The gate drive circuit is configured to generate an operation signal configured to activate the WBG switch. The profile of the operation signal is based on electrical characteristics of the gate drive circuit. For example, the gate drive circuit controls a rate of rise and/or slope (e.g., amplitude) of the operation signal. The profile of the operation signal is configured to sustain the WBG switch operation within the Miller plateau region. The profile of the operation signal may be divided into three different shaping phases. For example, during the first shaping phase a gate voltage of the WBG switch is above the threshold activating the WBG switch, during the second shaping phase the gate voltage is configured to be sustained to operate the WBG switch within the Miller plateau region, and during the third shaping phase the gate voltage is clamped.

At least one technical effect of various embodiments provides effective control of a drain voltage spike of the WBG switch. At least one technical effect of various embodiments provides low cost, easily implemented gate drive control circuit that enables control over the activation of the WBG switch without sacrificing deactivation of the WBG switch.

FIG. 1 illustrates a block diagram of an embodiment of a gate drive system 100. The gate drive system 100 includes a controller circuit 102 and a wide bandgap switch 106 (WBG switch). The controller circuit 102 is configured to control the operation (e.g., activate, deactivate) of the WBG switch 106. Additionally or alternatively, the switch 106 may represent a high electron mobility transistor (HEMT). The WBG switch 106 may include SiC, AlGaN, GaN, GaO, and/or the like. The WBG switch 106 may be configured to control an electrical system 108. The electrical system 108 may represent an electric power system for a variable frequency drive, a drive train, a home appliance, and/or the like. The WBG switch 106 may be configured to switch between an ON state (e.g., saturation state) and an OFF state at a static and/or variable frequency (e.g., 100 kHz, 2 MHz, and/or the like) based on control signals received by the controller circuit 102.

The controller circuit 102 may be embodied in hardware, such as one or more processors, controller, or other logic-based device, that performs functions or operations based on one or more sets of instructions (e.g., software). Additionally or alternatively, the controller circuit 102 may be an application specific integrated circuit, a field programmable gate array, and/or the like configured to control the electrical system 108 via a gate drive circuit 104. The instructions on which the hardware operates may be stored on a tangible and non-transitory (e.g., not a transient signal) computer readable storage medium, such as memory. The memory may include one or more computer hard drives, flash drives, RAM, ROM, EEPROM and/or the like. Alternatively, one or more of the sets of instructions that direct operations of the hardware may be hard-wired into the logic of the hardware.

The controller circuit 102 is configured to control the electrical system 108 based on control signals transmitted and/or communicated to the gate drive circuit 104. In connection with FIG. 2, the gate drive circuit 104 may include a control switch 202 and a first and second shaping circuits 204, 206.

Figure 2:
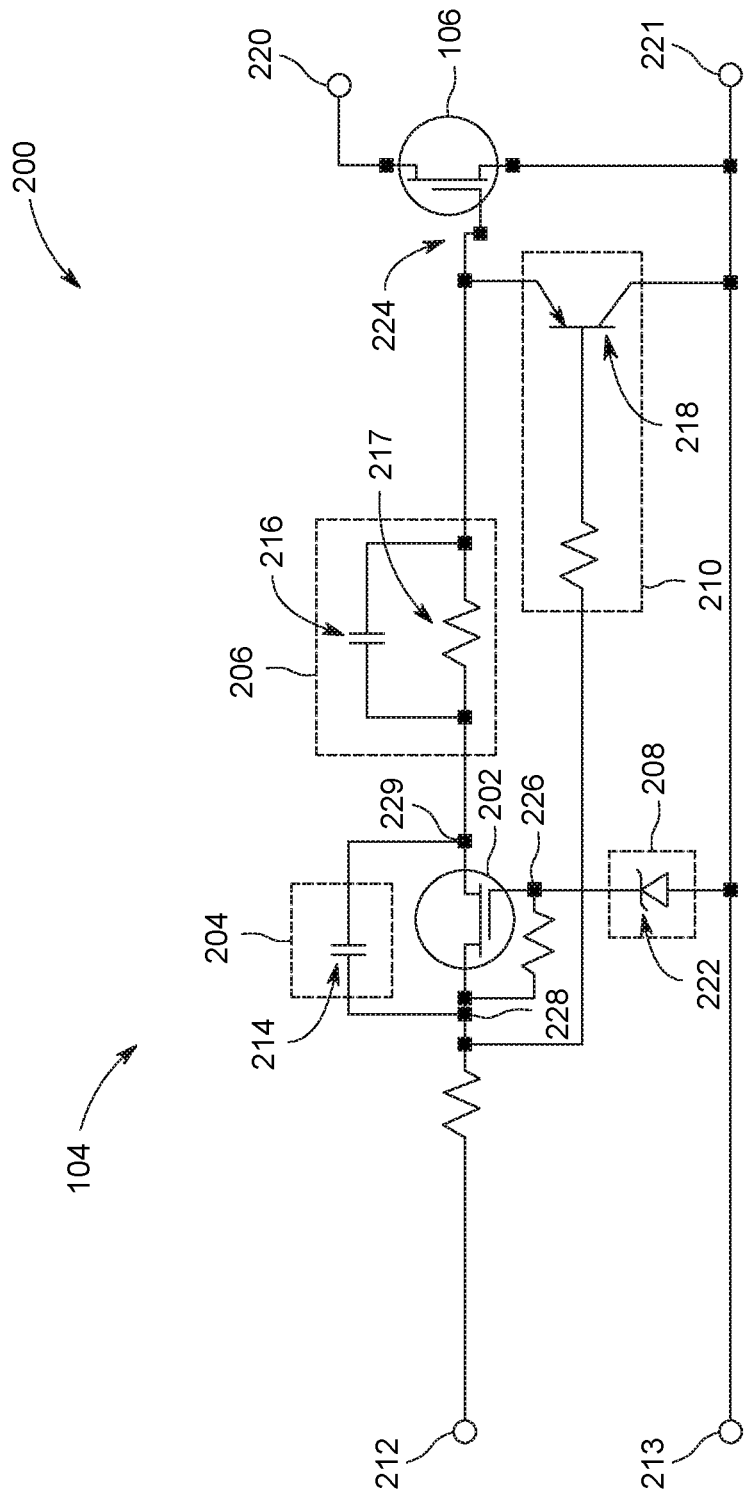
FIG. 2 illustrates a schematic illustration of an embodiment of a gate drive circuit.

FIG. 2 illustrates a schematic illustration 200 of an embodiment of the gate drive circuit 104. The control switch 202 is conductively coupled to a control terminals 212, 213 and a gate terminal 224 of the WBG switch 106. The control switch 202 may be a wide bandgap semiconductor similar to and/or the same as the WBG switch 106. For example, the control switch 202 may include SiC, AlGaN, GaN, GaO, and/or the like. In another example, the control switch 202 and the WBG switch 106 may have a common threshold voltage (e.g., activation voltage) and/or electrical characteristics. Additionally or alternatively, the WBG switch 106 and the control switch 202 may both represent a high electron mobility transistor (HEMT). The control terminals 212, 213 are conductively coupled to the controller circuit 102. For example, the controller circuit 102 may send, transmit and/or conduct a control signal along the control terminal 212. The control signal may represent a pulse and/or electrical signal having a set voltage and/or current configured to enable the gate drive circuit 104 to generate the operation signal for the WBG switch 106.

A gate terminal 226 of the control switch 202 is conductively coupled to a voltage source 208. The voltage source 208 is configured to provide a voltage potential to the gate terminal 226 to activate the control switch 202. The voltage source 208 shown in FIG. 2 is a Zener diode 222. For example, the Zener diode 222 is conductive coupled to the control terminal 212 having a cathode of the Zener diode 222 directly coupled to the gate terminal 226. As the control signal is conducted from the control terminal 212 to the voltage source 208, a voltage potential is provided by the Zener diode 222 and at the gate terminal 226 activating the control switch 202.

Additionally or alternatively, the voltage source 208 may include a capacitor and/or a second control signal. For example, as the control signal is conducted from the control terminal 212 to the voltage source 208, a voltage potential is provided by the capacitor and at the gate terminal 226. In another example, the voltage source 208 may correspond to a second control terminal conductively coupled to the controller circuit 102 separate from the control terminal 212. The controller circuit 102 may conduct the second control signal through the second control terminal configured to the gate terminal 226. Optionally, the second controller signal may be configured to provide a voltage potential to the capacitor and/or the Zener diode 222.

The gate drive circuit 104 includes the first shaping circuit 204 and the second shaping circuit 206. The first and second shaping circuits 204, 206 are configured to activate the WBG switch 106 via the gate terminal 224 when the control switch 202 is OFF (e.g., deactivated). For example, the first shaping circuit 204 is conductively coupled to separate and/or opposing terminals 228, 229 of the control switch 202. The first shaping circuit 204 is also conductively coupled to the WBG switch 106. Optionally, as shown in FIG. 2, the first shaping circuit 204 may include a capacitor 214. The second shaping circuit 204 is interposed between the gate terminal 224 and the control switch 202. Optionally, as shown in FIG. 2, the second shaping circuit 206 may include a capacitor 216 configured in parallel with a resistor 217. The first and second shaping circuits 204, 206 may be configured to have similar and/or the same electrical characteristics, such as the components (e.g., the capacitor 214, the capacitor 216, the resistor 217) may have a common temperature coefficient.

Figure 3:
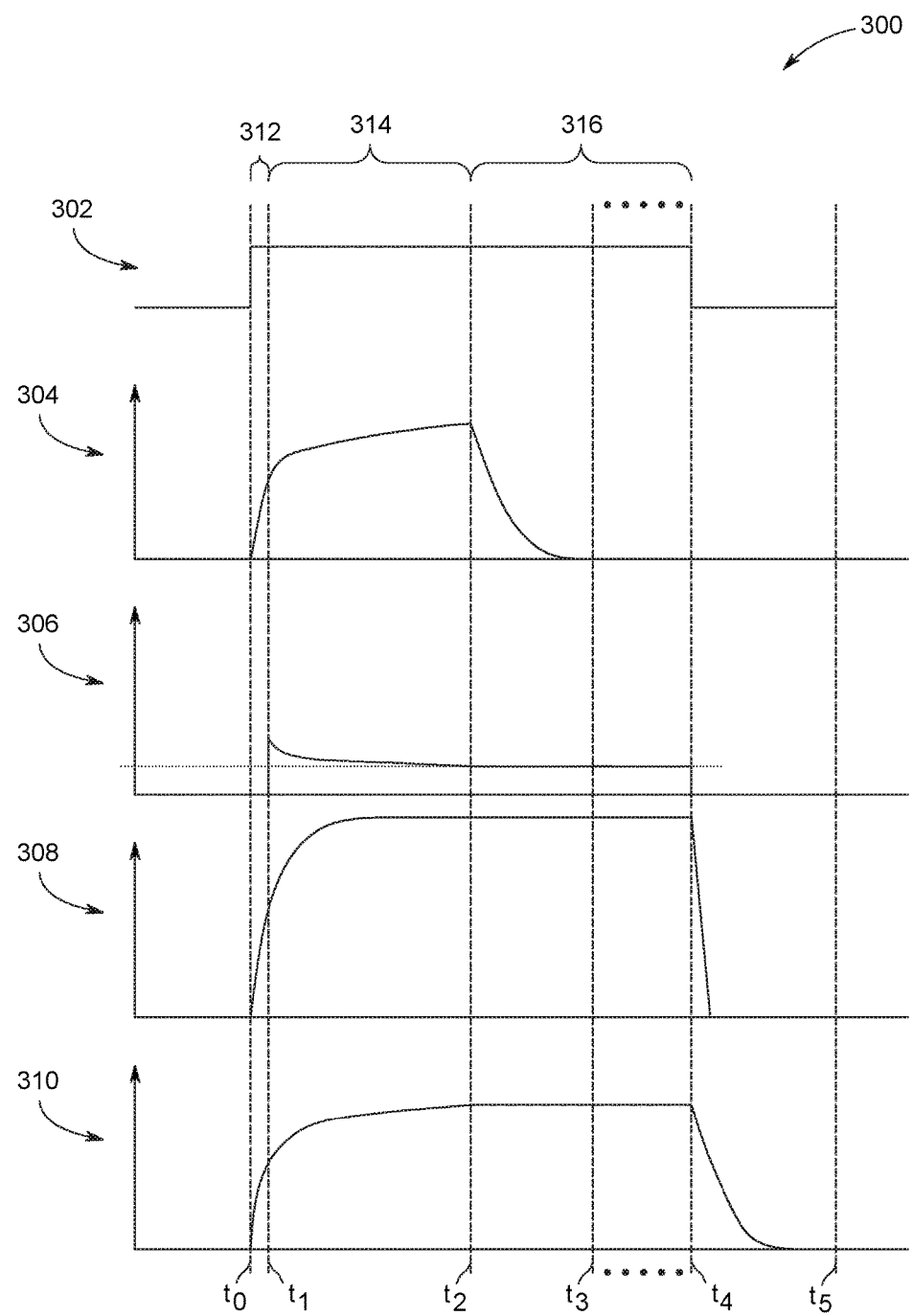
FIG. 3 illustrates a timing diagram of an embodiment of electrical waveforms of the gate drive circuit shown in FIG. 2.

In connection with FIG. 3, the first and second shaping circuits 204, 206 and the control switch 202 are configured to define an operation signal (e.g., the electrical waveform 308). The operation signal is formed by three shaping phases 312, 314, 216 forming a profile. The first shaping phase 312 may be defined by the electrical characteristics of the first and second shaping circuits 204, 206. The second shaping phase 314 may be defined by the second shaping circuit 206 and the control switch 202. The third shaping phase 316 may be defined by the control switch 202.

FIG. 3 illustrates a timing diagram 300 of an embodiment of electrical waveforms 302, 304, 306, 308, 310 of the gate drive circuit 104 shown in FIG. 2. The electrical waveform 302 represents a voltage of the control terminal 212 with respect to the control terminal 213. The electrical waveform 304 represents a voltage of the first shaping circuit 204. The electrical waveform 306 represents a voltage at the gate terminal 226 relative to a voltage at the terminal 229 (e.g., Vgs). The electrical waveform 308 represents the operation signal or the voltage at the gate terminal 224. The electrical waveform 310 represents a voltage of the second shaping circuit 206.

The timing diagram 300 is subdivided into set time periods and/or divisions (e.g., $t_0$-$t_5$) associated with the shaping phases 312, 314, 316 of the operation signal. Optionally, the time periods may be continually repeated at a set frequency and/or intermittently by the controller circuit 102. At $t_0$, the controller circuit 102 transmits and/or sends a control signal along the control terminal 212. The control signal may represent a voltage pulse, such as the electrical waveform 302.

$t_0$-$t_1$ represent the first shaping phase 312 of the operation signal (e.g., the electrical waveform 308). The first shaping phase 312 may represent a short period of time, such as less than 0.1 microseconds (e.g., 0.001 microseconds). The first shaping phase 312 is defined by the electrical characteristics (e.g., capacitance) of the first and second shaping circuits 204, 206. For example, the operation signal at the first shaping phase 312 between $t_0$ and $t_1$ includes a slope. The slope is based on an amount of voltage across the first and second shaping circuit 204, 206. For example, the rate and/or increase of the voltage of the first shaping phase 312 is based on a capacitance of the capacitors 214 and 216.

At $t_1$, the voltage source 208 may activate the control switch 202. For example, the Zener diode 222 of the voltage source 208 is configured to provide a voltage at the gate terminal 226 based on the control signal. The voltage at the gate terminal 226 with respect to the voltage at the terminal 229 may be above the activation threshold of the control switch 202. When the control switch 202 is activated, the voltage at the capacitor 214 may discharge.

$t_1$-$t_2$ represent the second shaping phase 314 of the operation signal (e.g., the electrical waveform 308). The second shaping phase 314 may represent a longer period of time relative to the first shaping phase 312. For example, the second shaping phase 314 may be proximate to 0.1 microseconds (e.g., 80 nanoseconds). The second shaping phase 314 is configured to transition the WBG switch 106 within the Miller plateau. For example, during the second shaping phase 314 the operator signal is configured to control the gate terminal 224 of the WBG switch 106 to continually operate the WBG switch 106 within the Miller plateau through the third shaping phase 316. The second shaping phase 314 is defined by the electrical characteristics of the second shaping circuits 206 and/or the control switch 202. For example, the operation signal at the second shaping phase 314 between $t_1$ and $t_2$ includes a curve configured to have an ascending curve. The ascending curve transitions by decreasing the curve angle from the slope of the first shaping phase 312 to a clamped voltage of the third shaping phase 316. A rate of the decrease in curve angle of the ascending curve is based on electrical characteristics of the second shaping circuit 206, such as the resistance of the resistor 217. For example, the resistance may adjust a rate at which the curve angle is decreased to form the ascending curve, such as a higher resistance has a higher rate of decrease of the curve angle relative to a lower resistance of the resistor 217.

The electrical characteristics of the control switch 202 is configured to set a maximum voltage of the operator signal to operate the WBG switch 106 in the Miller plateau. For example, the control switch 202 is configured to clamp the operator signal. During the second shaping phase 314, the control switch 202 is configured to operate in a Miller plateau. For example, when the control switch 202 operates beyond the Miller plateau voltage at the terminal 228 is reduced, which decreases the voltage at the gate terminal 226 returning the control switch 202 operation to the Miller plateau.

At $t_2$, the control switch 202 may continually operate in the Miller plateau based on feedback at the gate terminal 226, thereby clamping the voltage of the operation signal (e.g., the electrical waveform 308) during the third shaping phase 316. Based on the activation of the control switch 202, voltage across the capacitor 214 of the first shaping circuit 204 is discharged. $t_2$-$t_4$ represent the third shaping phase 316 of the operation signal. For example, between $t_3$-$t_4$ the controller circuit 102 may continually operate the WBG switch 106 for a duration of the control signal until such a time when the control signal is off.

At $t_4$, the controller circuit 108 may terminate the control signal along the control terminal 212, as shown by the electrical waveform 302. For example, the controller circuit 108 may be configured to activate a shut off circuit 210 (shown in FIG. 2). The shut off circuit 210 is conductively coupled to the gate terminal 224 of the WBG switch 106 and the control terminals 212, 213. The shut off circuit 210 may be configured to clamp a voltage of the gate terminal 224 deactivating the WBG switch 106. For example, the shut off circuit 210 may include a semiconductor switch 218. When the semiconductor switch 218 is activated (e.g., turned ON), the voltage at the gate terminal 224 is reduced below a threshold voltage of the WBG switch 106, thereby deactivating the WBG switch 106

Figure 4:
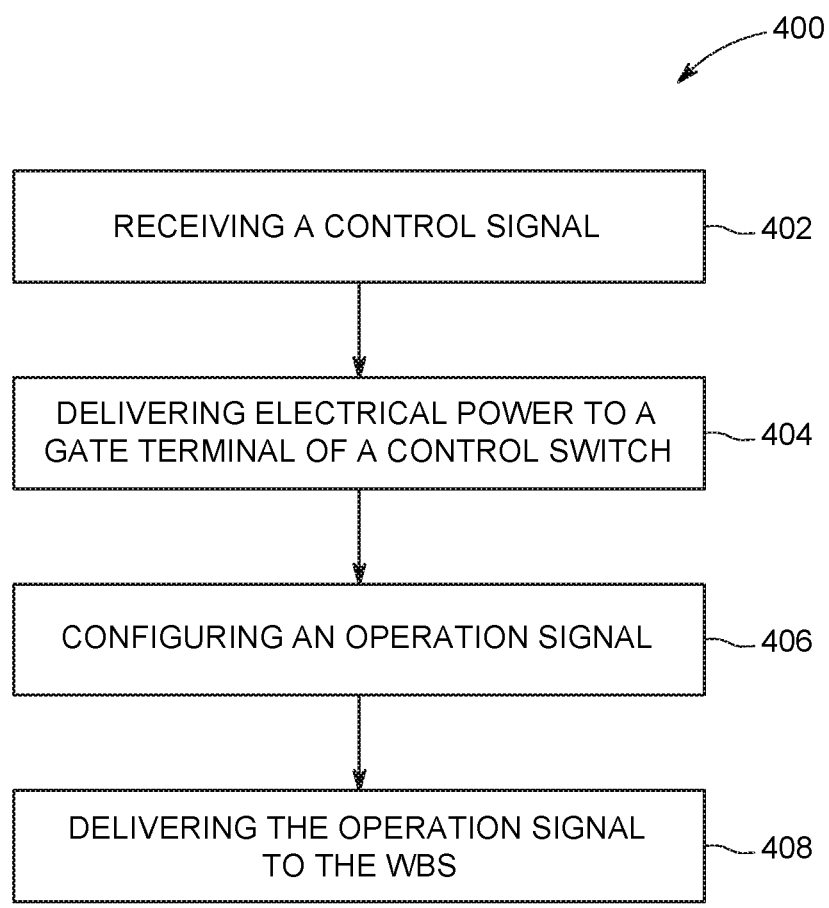
FIG. 4 is a flow chart of an embodiment of a method for operating a wide bandgap switch.

FIG. 4 is a flow chart of an embodiment of a method 400 for operating the WBG switch 106. The method 400, for example, may employ or be performed by structures or aspects of various embodiments discussed herein. In various embodiments, certain operations may be omitted or added, certain operations may be combined, certain operations may be performed simultaneously, certain operations may be performed concurrently, certain operations may be split into multiple operations, certain operations may be performed in a different order, or certain operations or series of operations may be re-performed in an iterative fashion. In various embodiments, portions, aspects, and/or variations of the method 400 may be able to be used as one or more algorithms to direct hardware to perform one or more operations described herein.

Figure 5:
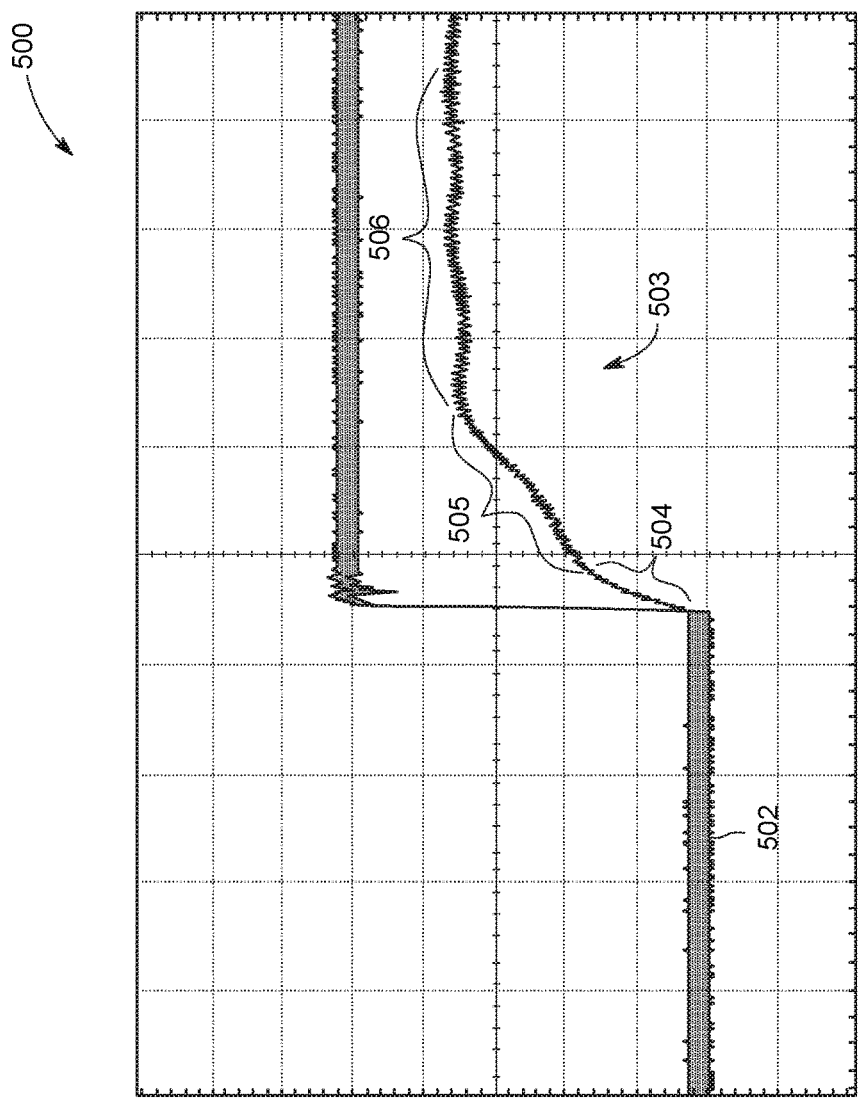
FIG. 5 is a graphical illustration of an embodiment of a control and operator signal.

Beginning at 402, the gate drive circuit 104 may receive a control signal. FIG. 5 is a graphical illustration 500 of an embodiment of a control signal 502 and an operator signal 503. For example, the controller circuit 108 transmits and/or sends a control signal 502 along the control terminal 212. The control signal 502 may represent a voltage pulse. The controller signal 502 may be similar to and/or the same as the electrical waveform 302 shown in FIG. 3.

At 404, the voltage source 208 is configured to deliver electrical power to the gate terminal 226 of the control switch 202. The voltage source 208 may include the Zener diode 222 (as shown in FIG. 2), a capacitor, and/or a second control signal. For example, the voltage source 208 is conductively coupled to the control terminal 212. As the control signal is conducted from the control terminal 212 to the voltage source 208, a voltage potential may be provided by the Zener diode 222 (shown in FIG. 2) and/or the capacitor. The voltage potential represent electrical power, which is provided to the gate terminal 226 activating the control switch 202. In another example, a second control terminal may be conductively coupled to the controller circuit 102 separate from the control terminal 212. The controller circuit 102 may conduct the second control signal through the second control terminal to the gate terminal 226, which provides electrical power.

At 406, the gate drive circuit 104 configured to generate the operation signal 503. In connection with FIG. 5, the operation signal 503 may have a profile formed by three shaping phases 504-506. For example, each of the shaping phases 504-506 may have a different slope forming the profile, which is defined by the electrical characteristics of the first and second shaping circuits 204, 206 and the control switch 202. The first shaping phase 504 may be defined by the electrical characteristics of the first and second shaping circuits 204, 206. For example, the first shaping phase 504 may represent a slope based on an amount of voltage across the first and second shaping circuit 204, 206. The slope corresponding to a rate and/or increase of the voltage of the first shaping phase 504 based on a capacitance of the capacitors 214 and 216. The second shaping phase 505 may be defined by the second shaping circuit 206 and the control switch 202. For example, the second shaping phase 314 may represent a curve shaped as an ascending curve based on electrical characteristics of the second shaping circuit 206, such as the resistance of the resistor 217. For example, the resistance (e.g., of the resistor 217) of the second shaping circuit 206 may adjust a rate at which the curve angle is adjusted from the first shaping phase 504 to the second shaping phase 505. The curve angle of the second shaping phase 505 is decreased relative to the slope of the first shaping phase 504 based on the resistance of the second shaping circuit 206. The decrease in the curve angle relative to the first shaping phase 504, which forms the ascending curve, is based on a magnitude of the resistance of the resistor 217. For example, a resistor 217 having a higher resistance has a higher rate of decrease of the curve angle relative to a lower resistance of the resistor 217. The third shaping phase 506 may be defined by the control switch 202. For example, the control switch 202 is configured to clamp the operator signal 503 during the third shaping phase 506 to a set voltage having a slope of approximately zero and/or within a predetermined threshold to the set voltage.

At 408, the gate drive circuit 104 is configured to deliver the operation signal 503 to the WBG switch 106. For example, the gate drive circuit 104 is conductively coupled to the gate terminal 224 of the WBG switch 106, thereby delivering the operation signal 504 to the WBG switch 106.

It should be noted that the particular arrangement of components (e.g., the number, types, placement, and/or the like) of the illustrated embodiments may be modified in various alternate embodiments. For example, in various embodiments, different numbers of a given module or unit may be employed, a different type or types of a given module or unit may be employed, a number of modules or units (or aspects thereof) may be combined, a given module or unit may be divided into plural modules (or sub-modules) or units (or sub-units), one or more aspects of one or more modules may be shared between modules, a given module or unit may be added, or a given module or unit may be omitted.

As used herein, a structure, limitation, or element that is "configured to" perform a task or operation is particularly structurally formed, constructed, or adapted in a manner corresponding to the task or operation. For purposes of clarity and the avoidance of doubt, an object that is merely capable of being modified to perform the task or operation is not "configured to" perform the task or operation as used herein. Instead, the use of "configured to" as used herein denotes structural adaptations or characteristics, and denotes structural requirements of any structure, limitation, or element that is described as being "configured to" perform the task or operation. For example, a processing unit, processor, or computer that is "configured to" perform a task or operation may be understood as being particularly structured to perform the task or operation (e.g., having one or more programs or instructions stored thereon or used in conjunction therewith tailored or intended to perform the task or operation, and/or having an arrangement of processing circuitry tailored or intended to perform the task or operation). For the purposes of clarity and the avoidance of doubt, a general purpose computer (which may become "configured to" perform the task or operation if appropriately programmed) is not "configured to" perform a task or operation unless or until specifically programmed or structurally modified to perform the task or operation.

It should be noted that the various embodiments may be implemented in hardware, software or a combination thereof. The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM), Read Only Memory (ROM), EEPROM and/or the like. The computer or processor further may include a storage device, which may be a hard disk drive or a removable storage drive such as a solid state drive, optic drive, and the like. The storage device may also be other similar means for loading computer programs or other instructions into the computer or processor.

As used herein, the term "computer," "controller," and "module" may each include any processor-based or microprocessor-based system including systems using microcontrollers, reduced instruction set computers (RISC), application specific integrated circuits (ASICs), logic circuits, GPUs, FPGAs, and any other circuit or processor capable of executing the functions described herein. The above examples are exemplary only, and are thus not intended to limit in any way the definition and/or meaning of the term "module" or "computer."

The computer, module, or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer, module, or processor as a processing machine to perform specific operations such as the methods and processes of the various embodiments described and/or illustrated herein. The set of instructions may be in the form of a software program. The software may be in various forms such as system software or application software and which may be embodied as a tangible and non-transitory computer readable medium. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program. The individual components of the various embodiments may be virtualized and hosted by a cloud type computational environment, for example to allow for dynamic allocation of computational power, without requiring the user concerning the location, configuration, and/or specific hardware of the computer system.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

This written description uses examples to disclose the various embodiments, and also to enable a person having ordinary skill in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal language of the claims.

What is claimed is:

1. A gate drive system comprising:
   a wide bandgap switch (WBG switch);
   a control switch conductively coupled between a first terminal and a gate terminal of the WBG switch, wherein the WBG switch and the control switch are configured to have a common threshold voltage;
   first and second shaping circuits conductively coupled to the control switch and the gate terminal of the WBG switch, wherein the first and second shaping circuits and the control switch are configured to define an operation signal, the operation signal being configured to activate the WBG switch, a profile of the operation signal being based on electrical characteristics of the first and second shaping circuits;
   wherein the first shaping circuit is connected across the first terminal and a second terminal of the control switch; and
   wherein the second shaping circuit is connected between the gate terminal of the WBG switch and the second terminal of the control switch.

2. The gate drive system of claim 1, wherein the operation signal is formed by three shaping phases, a first shaping phase is defined by the electrical characteristics of the first and second shaping circuits, a second shaping phase is defined by the electrical characteristics of the second shaping circuit and the control switch, and a third shaping phase is defined by the control switch.

3. The gate drive system of claim 2, wherein during the second shaping phase the control switch is configured to operate within a Miller plateau.

4. The gate drive system of claim 2, wherein the second shaping circuit includes a capacitor configured in parallel with a resistor, a resistance of the resistor is configured to define an ascending curve of the second shaping phase.

5. The gate drive system of claim 2, wherein the control switch is configured to clamp a voltage of the operation signal during the third shaping phase.

6. The gate drive system of claim 2, wherein an electrical characteristic of the second shaping phase is configured to operate the WBG switch within a Miller plateau.

7. The gate drive system of claim 1, a gate terminal of the control switch is conductively coupled to a voltage source.

8. The gate drive system of claim 7, wherein the voltage source is a diode, a capacitor, or a control signal.

9. The gate drive system of claim 1, wherein the first and second shaping circuits are configured to have a common temperature coefficient.

10. The gate drive system of claim 1, further comprising a shut off circuit conductively coupled to the gate terminal of the WBG switch and the first terminal, wherein the shut off circuit is configured to clamp the gate terminal.

11. The gate drive system of claim 1, wherein the WBG switch and the control include Silicon Carbide, Aluminum Gallium Nitride, Gallium Nitride, or Gallium Oxide.

12. A method, comprising:
    receiving a control signal at a first terminal of a control switch;
    configuring an operation signal via the control switch, wherein the operation signal is configured to activate a wide bandgap switch (WBG switch), wherein a profile of the operation signal is based on electrical characteristics of first and second shaping circuits;
    delivering the operation signal to the WBG switch;

wherein the first shaping circuit is connected across the first terminal and a second terminal of the control switch; and wherein the second shaping circuit is connected between a gate terminal of the WBG switch and the second terminal of the control switch.

13. The method of claim 12, wherein the configuring operation includes forming three shaping phases of the operation signal, the first shaping phase is defined by the electrical characteristics of the first and second shaping circuits, the second shaping phase is defined by the electrical characteristics of the second shaping circuit and a control switch, and a third shaping phase is defined by the control switch.

14. The method of claim 13, wherein the second shaping circuit includes a capacitor configured in parallel with a resistor, a resistance of the resistor is configured to define a curve of the second shaping phase.

15. The method of claim 13, further comprising clamping a voltage of the operation signal during the third shaping phase.

16. The method of claim 13, further comprising operating the WBG switch within a Miller plateau during the second shaping phase.

17. The method of claim 12, further comprising delivering electrical power to a gate terminal of the control switch, wherein the electrical power is delivered from a diode, a capacitor, or a control signal.

18. The method of claim 12, wherein the first and second shaping circuits are configured to have a common temperature coefficient.

19. A gate drive system comprising:
a wide bandgap switch (WBG switch);
a control switch conductively coupled between a first terminal and a gate terminal of the WBG switch, wherein the WBG switch and the control switch are configured to have a common activation threshold, the control switch having a gate terminal conductively coupled to a voltage source, the voltage source being a diode, a capacitor, or a control signal;
first and second shaping circuits conductively coupled to the control switch and the gate terminal of the WBG switch, wherein the first and second shaping circuits and the control switch are configured to define an operation signal, the operation signal being formed by three shaping phases, a first shaping phase is defined by the electrical characteristics of the first and second shaping circuits, a second shaping phase is defined by the electrical characteristics of the second shaping circuit and the control switch, and a third shaping phase is defined by the control switch, wherein the operation signal is configured to activate the WBG switch, a profile of the operation signal being based on electrical characteristics of the first and second shaping circuits;
wherein the first shaping circuit is connected across the first terminal and a second terminal of the control switch; and
wherein the second shaping circuit is connected between the gate terminal of the WBG switch and the second terminal of the control switch.

20. The gate drive system of claim 19, wherein the WBG switch and the control include Silicon Carbide, Aluminum Gallium Nitride, Gallium Nitride, or Gallium Oxide.

* * * * *